(12) United States Patent
Li et al.

(10) Patent No.: US 12,111,349 B2
(45) Date of Patent: Oct. 8, 2024

(54) MIXED SIGNAL TEST DEVICE BASED ON GRAPHICAL CONTROL

(71) Applicant: Macrotest Semiconductor Inc., Nanjing (CN)

(72) Inventors: Quanren Li, Nanjing (CN); Guoliang Mao, Nanjing (CN)

(73) Assignee: Macrotest Semiconductor Inc., Nanjing (CN)

( * ) Notice: Subject to any disclaimer, the term of this patent is extended or adjusted under 35 U.S.C. 154(b) by 0 days.

(21) Appl. No.: 17/801,528

(22) PCT Filed: Apr. 18, 2022

(86) PCT No.: PCT/CN2022/087320
§ 371 (c)(1),
(2) Date: Aug. 23, 2022

(87) PCT Pub. No.: WO2023/024531
PCT Pub. Date: Mar. 2, 2023

(65) Prior Publication Data
US 2024/0219456 A1    Jul. 4, 2024

(30) Foreign Application Priority Data
Aug. 27, 2021    (CN) .......................... 202110992479.1

(51) Int. Cl.
*G01R 31/28*    (2006.01)
(52) U.S. Cl.
CPC .............................. *G01R 31/2884* (2013.01)

(58) Field of Classification Search
CPC .................................................. G01R 31/2884
See application file for complete search history.

(56) References Cited

U.S. PATENT DOCUMENTS

| | | | |
|---|---|---|---|
| 4,646,299 A * | 2/1987 | Schinabeck | G01R 31/31922 702/120 |
| 7,072,781 B1 * | 7/2006 | Gershon | G01R 31/31908 324/426 |

(Continued)

*Primary Examiner* — Akm Zakaria
(74) *Attorney, Agent, or Firm* — Hemisphere Law, PLLC; Zhigang Ma

(57) ABSTRACT

The present disclosure discloses a mixed signal test device based on graphical control. A Tester-On-board architecture is used to extend a power generation and measurement unit, an analog waveform generation and collection unit and an analog waveform control unit on a digital waveform pattern generation and measurement board. The logic control unit is configured to generate and measure a digital pattern of a System on Chip (SOC) to be tested to achieve generation and collection of the digital waveform, is configured to control the analog waveform control unit to achieve generation and collection control of an analog waveform of the SOC to be tested, and is configured to control the power generation and measurement unit to achieve generation and collection control of power of the SOC to be tested, so that generation and measurement of the digital pattern of the SOC to be tested, generation and collection control of the analog waveform, and generation and collection control of the power are simultaneously concurrently executed. The mixed signal test device based on graphical control is easy and efficient in resource coordination and control.

6 Claims, 4 Drawing Sheets

(56) References Cited

U.S. PATENT DOCUMENTS

| | | | |
|---|---|---|---|
| 7,092,837 B1* | 8/2006 | Lanier | G11C 29/56 |
| | | | 702/121 |
| 9,910,086 B2* | 3/2018 | Czamara | G01R 31/2834 |
| 2004/0068699 A1* | 4/2004 | Morris | G01R 31/31915 |
| | | | 714/733 |
| 2007/0035321 A1 | 2/2007 | Gorodetsky et al. | |
| 2008/0284454 A1 | 11/2008 | Chih et al. | |
| 2013/0326299 A1* | 12/2013 | Oshima | G01R 31/3177 |
| | | | 714/735 |
| 2014/0109029 A1 | 4/2014 | Bai et al. | |

* cited by examiner

MIXED SIGNAL TEST DEVICE BASED ON GRAPHICAL CONTROL

TECHNICAL FIELD

The present disclosure relates to a mixed signal test device based on graphical control, and belongs to the field of Auto Test Equipment (ATE), integrated circuit ATE, semiconductor manufacturing, instruments and apparatuses, mixed signal chip tests, and the like.

BACKGROUND ART

With the development of the Internet of Things and intelligence, more and more System On Chips (SOCs) are internally integrated with Micro Control Units (MCUs) and Analog-Digital Conversion (ADC)/Digital-Analog Conversion (DAC) analog generation and collection modules. At the same time, the price for consuming an SOC chip is also increasingly low, and chip design companies have increasingly strict requirements on the cost. Existing platforms with medium and high-speed digital-analog mixed signal testing capability are basically monopolized by foreign equipment companies, so they are expensive. A mixed signal test solution of a foreign semiconductor equipment company is basically completed by three functional boards: One board is a digital waveform pattern generation and measurement board 102; another board is an analog waveform generation and collection board 103; and the other board is a power generation and measurement board 104, as shown in FIG. 1.

Since resources required for a test are respectively on three independent boards, a system has a high requirement for resources; machines are bulky; and test equipment has high cost. During testing of a mixed signal chip, it is necessary to write a control function for the three boards. A writing program is complicated; static and dynamic parameters are inefficiently tested, which leads to cumbersome and inefficient coordination and control of resources required for the mixed signal testing, and makes it difficult to reduce the equipment cost.

SUMMARY

The purpose of the invention: For the problems in original mixed signal testing, the present disclosure provides a mixed signal test device based on graphical control, which makes it easy and efficient in resource coordination and control.

Technical solution: in order to achieve the above purpose, the present disclosure adopts the technical solution below.

A mixed signal test device based on graphical control uses a Tester-On-board architecture to extend a power generation and measurement unit, an analog waveform generation and collection unit, and an analog waveform control unit on a digital waveform pattern generation and measurement board; the digital waveform pattern generation and measurement board includes a system bus, a board power supply unit, a digital control and collection unit, a logic control unit, a logic waveform data storage unit, and an analog waveform data storage unit.

The logic control unit is connected to the power generation and measurement unit, the digital control and collection unit, and the logic waveform data storage unit respectively; and the logic control unit is further connected to the analog waveform control unit through the system bus. The analog waveform control unit is connected to the analog waveform generation and collection unit and the analog waveform data storage unit respectively.

The logic control unit is configured to perform generation and measurement of a digital waveform pattern of a System on Chip (SOC) to be tested to achieve generation and collection of the digital waveform, is configured to control the analog waveform control unit to achieve generation and collection control of an analog waveform of the SOC to be tested, and is configured to control the power generation and measurement unit to achieve generation and collection control of power of the SOC to be tested, so that the generation and measurement of the digital waveform pattern of the SOC to be tested, the generation and collection control of the analog waveform of the SOC to be tested, and the generation and collection control of the power of the SOC to be tested, are executed in parallel.

Preferably, the system bus is configured to receive a main control command and data from the logic control unit, and distribute the main control command and the data to the analog waveform control unit and the power generation and measurement unit, so as to control the power generation and measurement unit and the analog waveform control unit to complete a high-speed test in a test vector.

Preferably, the mixed signal test device based on graphical control includes a board power supply unit which is configured to supply power to the logic control unit, the analog waveform control unit and the power generation and measurement unit.

Preferably, the logic control unit is connected to the digital control and collection unit through an electronic pin unit; the electronic pin unit is a 64-channel electronic pin unit which achieves logic waveform level conversion and small signal voltage and current output measurement.

Preferably the logic control unit is connected to the power generation and measurement unit through a voltage and current output measurement unit; the voltage and current output measurement unit is an 8-channel voltage and current output measurement unit; and the voltage and current output measurement unit is controlled by the logic control unit to achieve controllable voltage and current output measurement.

Preferably, the power generation and measurement unit comprises eight paths of power generation and measurement sub-units which are controlled by the logic control unit to achieve power generation and measurement.

Preferably, the analog waveform generation and collection unit comprises two paths of analog waveform generation and collection sub-units which are controlled by the logic control unit to achieve analog waveform generation and collection.

Compared with the prior art, the present disclosure has the following beneficial effects:

1: The equipment cost is reduced. Due to the design of a shared unit, the present disclosure only needs one set of unit compared with the original technology where three independent boards are all required to be provided with a power supply, a bus controller and a vector control unit, so that the overall cost is reduced by ⅓ or above.

2: The test program development complexity is lowered. In the original test solution, when a mixed signal is tested, a power state needs to be first controlled before a test vector is executed; during the execution of the vector, an interrupt like mode needs to be invoked for multiple times to jump out of the vector execution state; in addition, dynamic parameter test, waveform generation test and the like are executed; the test development flow is complicated; and abnormalities easily occur. In the present disclosure, preset parameters are set. In the vector execution process, a power control command and a waveform generation and collection control command are synchronously sent, so that the development flow is simple.

3: The test efficiency is improved. Due to frequent interrupt processing in the test process, additional control and measurement are performed out of the vector execution, resulting in a waste of a lot of time. In the present disclosure, all preset parameters are downloaded for the first time only. During the vector execution, power and analog waveform generation and measurement are concurrently controlled, so that the test efficiency is greatly improved.

DETAILED DESCRIPTION OF THE EMBODIMENTS

The present disclosure will be further clarified below in combination with the accompanying drawings and specific embodiments. It should be understood that these examples are only used to illustrate the present disclosure and not to limit the scope of the present disclosure. Modifications made by those skilled in the art in various forms of valence all fall within the scope defined by the appended claims of the present application.

Figure 1:
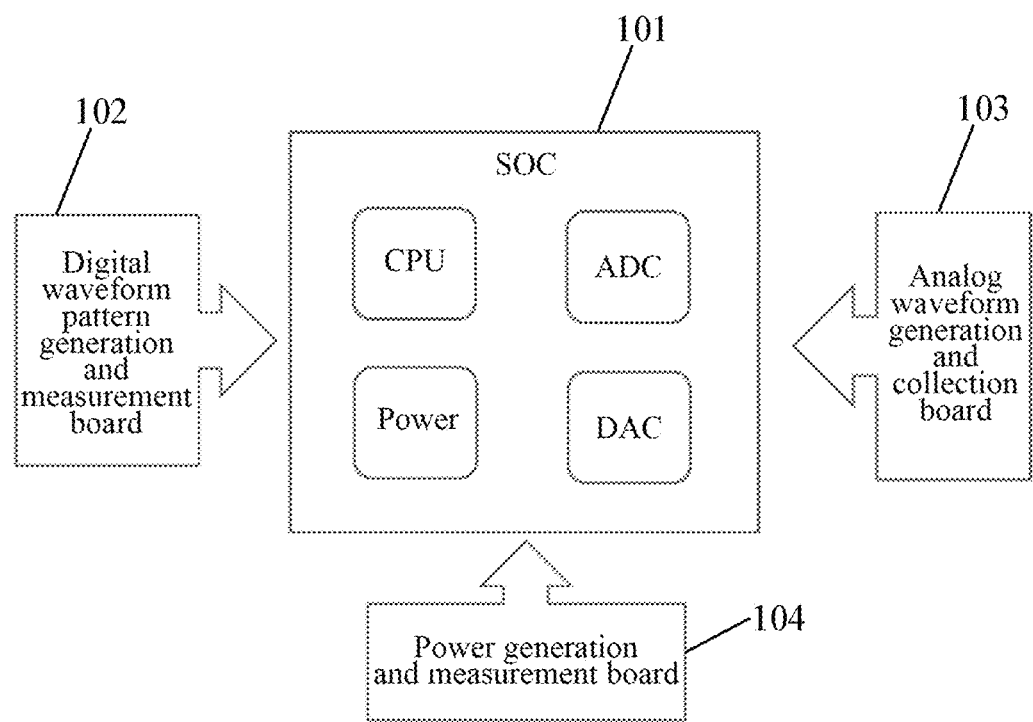
FIG. 1 is a schematic diagram of an existing mixed signal test solution.
Figure 2:
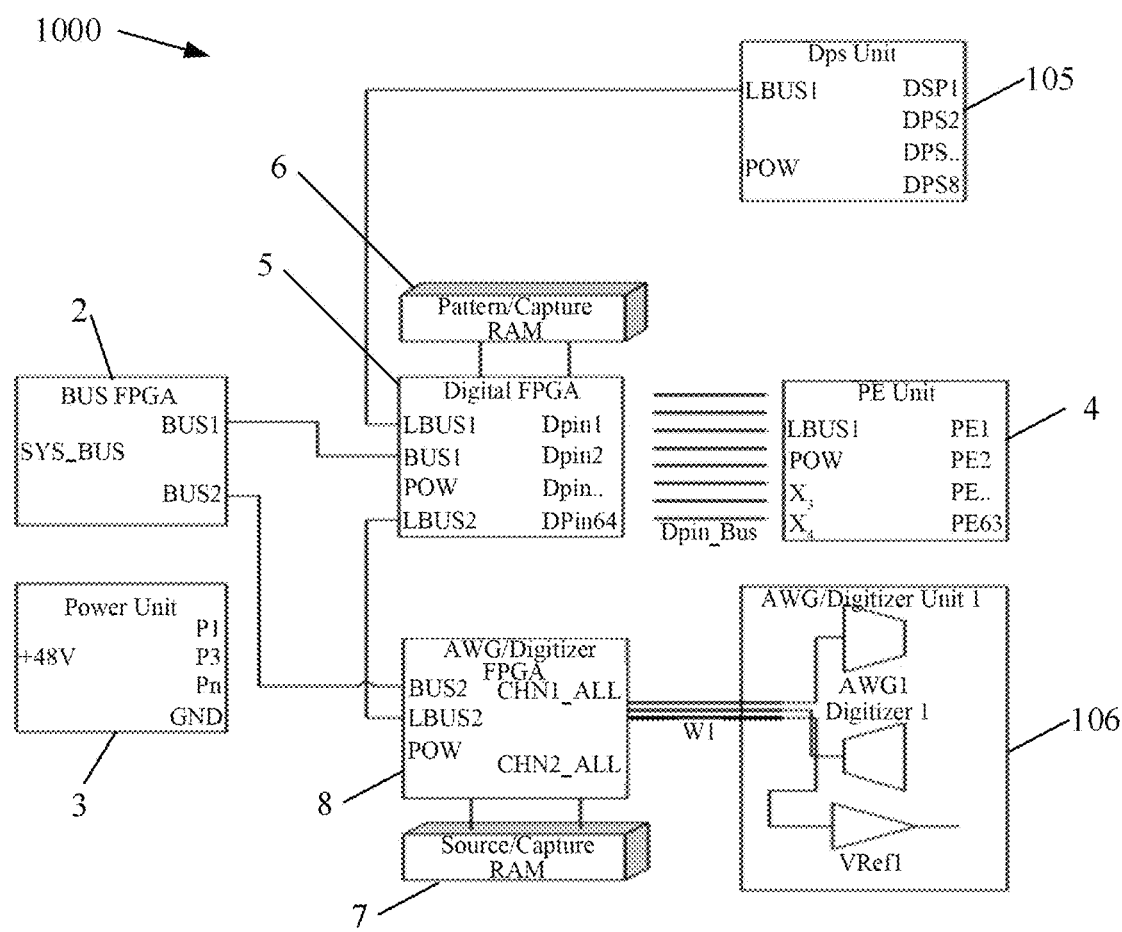
FIG. 2 is a schematic structural diagram of the present disclosure.

A mixed signal test device 1000 based on graphical control, as shown in FIG. 2, uses a Tester-On-board architecture to extend a power generation and measurement unit 105, an analog waveform generation and collection unit 106, and an analog waveform control unit 8 on an original digital waveform pattern generation and measurement board 102. The digital waveform pattern generation and measurement board 102 includes a system bus 2, a board power supply unit 3, a digital control and collection unit 4, a logic control unit 5, a logic waveform data storage unit 6 and an analog waveform data storage unit 7.

The logic control unit 5 is connected to the power generation and measurement unit 105, the digital control and collection unit 4, and the logic waveform data storage unit 6 respectively; and the logic control unit 5 is further connected to the analog waveform control unit 8 through the system bus 2. The analog waveform control unit 8 is connected to the analog waveform generation and collection unit 106 and the analog waveform data storage unit 7 respectively.

The system bus 2 is configured to receive a main control command and data from the logic control unit 5, and distribute the main control command and the data to the analog waveform control unit 8 and the power generation and measurement unit 105, so that the digital waveform pattern generation and measurement board 102 can directly control the power generation and measurement unit 105 and the analog waveform control unit 8 to complete a high-speed test in a test vector.

The board power supply unit 3 is configured to supply power to the power generation and measurement unit 105, the logic control unit 5, and the analog waveform control unit 8.

The logic control unit 5 is configured to perform generation and measurement of a digital waveform pattern of a System on Chip (SOC) to be tested 101 to achieve generation and collection of the digital waveform, is configured to control the analog waveform control unit 8 to achieve generation and collection control of an analog waveform of the SOC to be tested 101, and is configured to control the power generation and measurement unit 105 to achieve generation and collection control of power of the SOC to be tested 101, so that the generation and measurement of the digital waveform pattern of the SOC to be tested 101, the generation and collection control of the analog waveform of the SOC to be tested 101, and generation and collection control of the power of the SOC to be tested 101, are executed in parallel.

The logic waveform data storage unit 6 is configured to pre-store a digital waveform pattern generation vector and store a digital waveform collection pattern.

The logic control unit 5 is connected to an electronic pin unit 9 through the digital control and collection unit 4, where the electronic pin unit 9 is a 64-channel electronic pin unit which achieves logic waveform level conversion and small signal voltage and current output measurement.

The power generation and measurement unit 105 includes eight paths of power generation and measurement sub-units, which are controlled by the logic control unit 5 to achieve power generation and measurement. The logic control unit 5 is connected to the power generation and measurement unit 105 through a voltage and current output measurement unit. The voltage and current output measurement unit is 8-channel voltage and current output measurement unit, and is controlled by the logic control unit 5 to achieve controllable voltage and current output measurement.

The analog waveform control unit 8 is configured to perform generation and measurement control on any waveform.

The analog waveform data storage unit 7 is configured to pre-store analog waveform data and store analog waveform collection data.

The analog waveform generation and collection unit 106 includes two paths of analog waveform generation and collection sub-units which are controlled by the logic control unit 5 to achieve analog waveform generation and collection. In the embodiment, the analog waveform generation and collection unit 106 includes two paths of waveform generators, two paths of waveform collectors and two paths of accurate voltage reference sources, and is configured to generate and collect an analog waveform.

Figure 3:
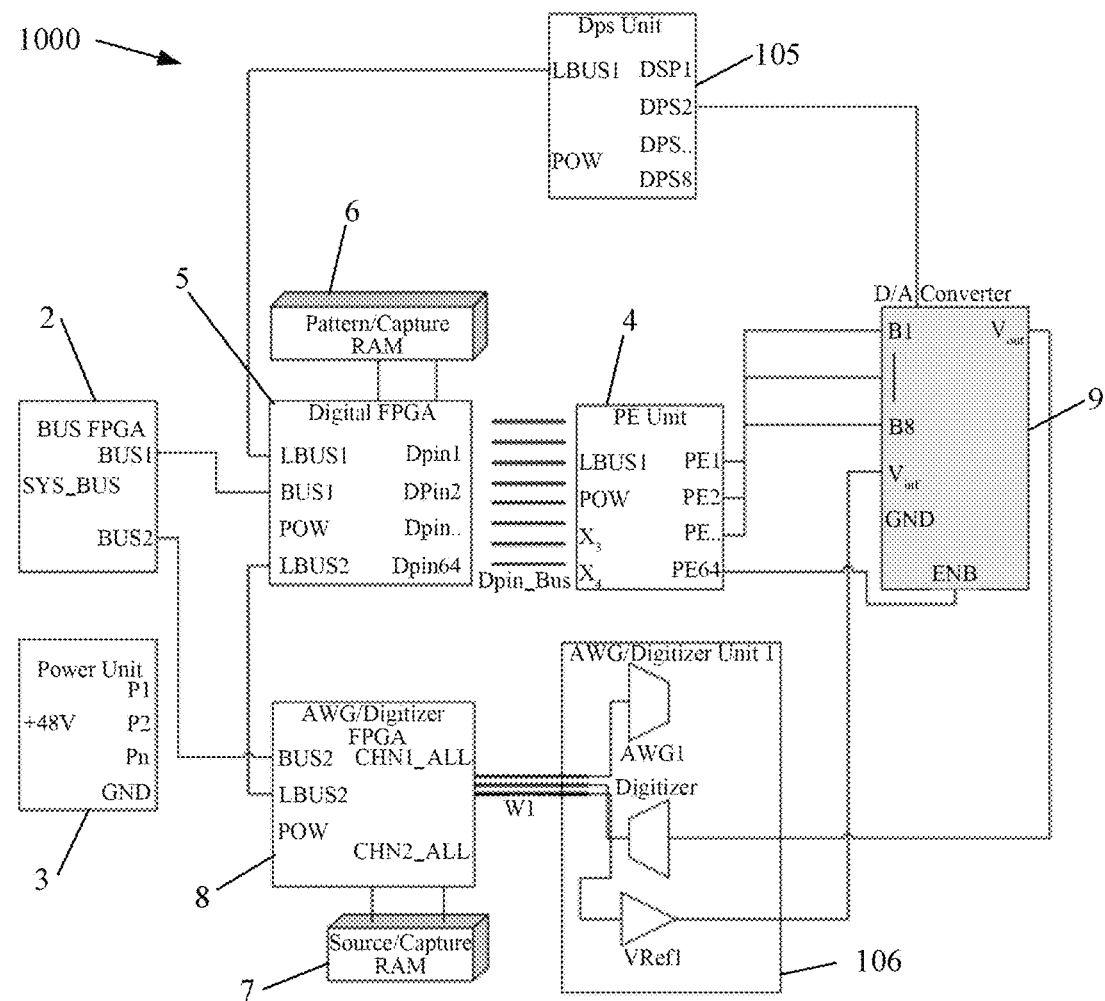
FIG. 3 is a schematic diagram of implementation of the present disclosure.

As shown in FIG. 3, DPS Unit (the power generation and measurement unit 105) provides power for the work of a chip under test; PE Unit (the digital control and collection unit 4) provides a digital control and collection signal for the chip under test; and AWG/Digitizer Unit (the analog waveform generation and collection unit 106) collects an analog signal of the chip under test.

Figure 4:
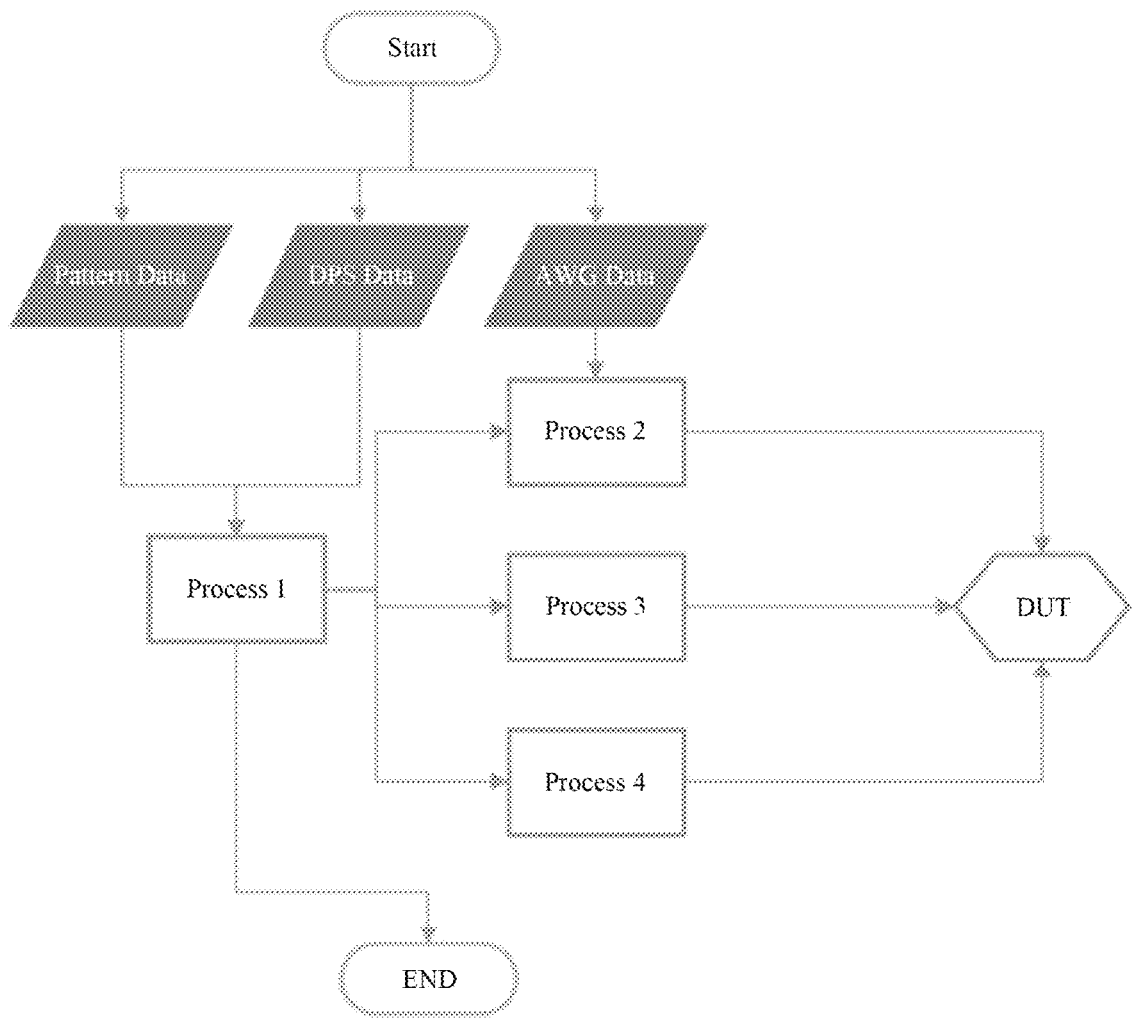
FIG. 4 is a flow chart of implementation of the present disclosure.

As shown in FIG. 4, before testing a mixed signal chip, the device 1000 pre-downloads multiple groups of setting data required by testing and puts the setting data into a memory (the analog waveform data storage unit 7 for storing Pattern Data, a power generation data storage unit for storing DPS Data, and the logic waveform data storage unit 6 for storing AWG Data); a test main control uses a main program "Process 1" to run a test vector, and the test vector integrates a high-speed command set for "Process 2", "Process 3" and "Process 4"; and the logic control unit 5 is controlled through "Process 2" to perform digital waveform pattern generation and measurement on an SOC to be tested 101, thus achieving generation and collection of a digital waveform. The analog waveform control unit 8 is controlled through "Process 3" to control analog waveform generation and collection of the SOC to be tested 101. The power generation and measurement unit 105 is controlled through "Process 4" to control power generation and collection of the SOC to be tested 101, thus achieving an effect of parallel execution of the digital waveform pattern generation and measurement, analog waveform generation and collection control, and power generation and collection control of the SOC to be tested 101.

Through the Tester On board architecture, the device 1000 of the present disclosure extends eight paths of power generation and measurement subunits and two paths of analog waveform generation and collection subunits in the original digital waveform pattern generation and measurement board 102; and by means of a local bus in the board, the digital waveform pattern generation and measurement board 102 can directly control the power generation and measurement unit 105 and the analog waveform control unit 8 to complete a high-speed test in a test vector. By the adoption of the Tester On Board architecture, the present disclosure solves the problem that the number of concurrent tests is limited by resources in the existing solution; and at the same time, by the use of a structure with a shared control unit, the problem of high cost of mixed signal test equipment is solved. With a set of high-speed commands, a function of controlling the analog waveform generation and collection unit 106 and the power generation and measurement unit 105 by a pattern vector is realized; and the problems of complicated writing of a mixed signal test program and low test efficiency are solved.

The structure of subunits can facilitate a user to have more choices in equipment extension, and an equipment space with the same volume can have more test resources. Since the power generation and measurement unit 105 and the analog waveform generation and collection unit 106 share a control circuit with the digital waveform pattern generation and measurement board 102, the equipment cost is greatly reduced. At the same time, a new set of high-speed commands are added to the digital waveform pattern generation and measurement board 102 to control the power generation and measurement unit 105 and the analog waveform generation and collection unit 106 to realize a function of graphical control of all resources, which greatly improves the test efficiency of mixed signal chips.

The above describes only the preferred embodiments of the present disclosure. It should be noted that those of ordinary skill in the art can further make several improvements and retouches without departing from the principles of the present disclosure. These improvements and retouches shall all fall within the protection scope of the present disclosure.

What is claimed is:

1. A mixed signal test device based on graphical control, wherein the device uses a Tester-On-board architecture to extend a power generation and measurement unit, an analog waveform generation and collection unit, and an analog waveform control unit on a digital waveform pattern generation and measurement board; the digital waveform pattern generation and measurement board comprises a system bus, a board power supply unit, a digital control and collection unit, a logic control unit, a logic waveform data storage unit, and an analog waveform data storage unit, wherein the board power supply unit is configured to supply power to the logic control unit, the analog waveform control unit and the power generation and measurement unit;

the logic control unit is connected to the power generation and measurement unit, the digital control and collection unit, and the logic waveform data storage unit respectively; the logic control unit is further connected to the analog waveform control unit through the system bus; the analog waveform control unit is connected to the analog waveform generation and collection unit, and the analog waveform data storage unit respectively;

the logic control unit is configured to perform generation and measurement of a digital waveform pattern of a System on Chip (SOC) to be tested to achieve generation and collection of the digital waveform, is configured to control the analog waveform control unit to achieve generation and collection control of an analog waveform of the SOC to be tested, and is configured to control the power generation and measurement unit to achieve generation and collection control of power of the SOC to be tested, so that the generation and measurement of the digital waveform pattern of the SOC to be tested, the generation and collection control of the analog waveform of the SOC to be tested, and the generation and collection control of the power of the SOC to be tested, are executed in parallel.

2. The mixed signal test device based on graphical control according to claim 1, wherein the system bus is configured to receive a main control command and data from the logic control unit, and distribute the main control command and the data to the analog waveform control unit and the power generation and measurement unit, so as to control the power generation and measurement unit and the analog waveform control unit to complete a high-speed test in a test vector.

3. The mixed signal test device based on graphical control according to claim 1, wherein the logic control unit is connected to an electronic pin unit through the digital control and collection unit; wherein the electronic pin unit is a 64-channel electronic pin unit which achieves logic waveform level conversion and small signal voltage and current output measurement.

4. The mixed signal test device based on graphical control according to claim 1, wherein the logic control unit is connected to the power generation and measurement unit through a voltage and current output measurement unit; wherein the voltage and current output measurement unit is an 8-channel voltage and current output measurement unit; and the voltage and current output measurement unit is controlled by the logic control unit to achieve controllable voltage and current output measurement.

5. The mixed signal test device based on graphical control according to claim 4, wherein the power generation and measurement unit comprises eight paths of power generation and measurement sub-units which are controlled by the logic control unit to achieve power generation and measurement.

6. The mixed signal test device based on graphical control according to claim 1, wherein the analog waveform generation and collection unit comprises two paths of analog waveform generation and collection sub-units which are controlled by the logic control unit to achieve analog waveform generation and collection.

* * * * *